(12) United States Patent
Wang et al.

(10) Patent No.: US 12,058,918 B2
(45) Date of Patent: Aug. 6, 2024

(54) TOUCH INPUT DISPLAY APPARATUS WITH INSULATION RECESS STRUCTURE HAVING OBTUSE ANGLED SIDEWALLS

(71) Applicant: WUHAN CHINA STAR OPTOELECTRONICS SEMICONDUCTOR DISPLAY TECHNOLOGY CO., LTD., Hubei (CN)

(72) Inventors: Haoran Wang, Hubei (CN); Jing Huang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/416,857

(22) PCT Filed: May 31, 2021

(86) PCT No.: PCT/CN2021/097455
§ 371 (c)(1),
(2) Date: Dec. 1, 2022

(87) PCT Pub. No.: WO2022/246875
PCT Pub. Date: Dec. 1, 2022

(65) Prior Publication Data
US 2024/0016040 A1     Jan. 11, 2024

(30) Foreign Application Priority Data

May 24, 2021    (CN) .......................... 202110563664.9

(51) Int. Cl.
*H10K 59/80*    (2023.01)
*G06F 3/041*    (2006.01)

(52) U.S. Cl.
CPC ......... *H10K 59/875* (2023.02); *G06F 3/0412* (2013.01)

(58) Field of Classification Search
None
See application file for complete search history.

(56) References Cited

U.S. PATENT DOCUMENTS

2019/0171318 A1* 6/2019 Ryu ..................... H10K 50/805
2021/0013452 A1* 1/2021 Kim ..................... G06F 3/0446
(Continued)

FOREIGN PATENT DOCUMENTS

CN    107026240 A    8/2017
CN    109599425 A    4/2019
(Continued)

*Primary Examiner* — Amare Mengistu
*Assistant Examiner* — Sarvesh J Nadkarni (57) ABSTRACT

A display panel disclosed by the present application includes: a base; a display layer, wherein the display layer includes light emitting units; and a touch layer, including a first insulation layer, a touch electrode layer, and a second insulation layer sequentially stacked, wherein the touch electrode layer includes touch electrodes. A first aperture is defined in a portion of the touch electrodes corresponding to the light emitting units. A first recess is defined in a portion of the first insulation layer corresponding to a gap between adjacent two of the light emitting units. An included angle between a sidewall of the first recess and a bottom surface of the first recess is an obtuse angle.

20 Claims, 4 Drawing Sheets

(56) References Cited

U.S. PATENT DOCUMENTS

2021/0143366 A1    5/2021  Park
2022/0190067 A1*   6/2022  Byun .................... G06F 3/0412
2022/0231089 A1*   7/2022  Cho ......................... G03F 1/32

FOREIGN PATENT DOCUMENTS

| CN | 110007802 A | 7/2019 |
| --- | --- | --- |
| CN | 111916474 A | 11/2020 |
| CN | 112216726 A | 1/2021 |
| CN | 112885972 A | 6/2021 |

\* cited by examiner

TOUCH INPUT DISPLAY APPARATUS WITH INSULATION RECESS STRUCTURE HAVING OBTUSE ANGLED SIDEWALLS

FIELD OF INVENTION

The present application relates to a field of display technologies, especially to a display panel and an electronic apparatus.

BACKGROUND OF INVENTION

Generally, to improve light emission efficiency, lower power consumption, and prolong lifespan, some light extraction structures would be disposed for implementing light extraction to further enhance external quantum efficiency of a light emitting device.

At present, two layers of low temperature curing organic material are prepared on a touch layer. By combining an organic layer having a low refractive index and an organic layer of a high refractive index to form an inclined interface, light is converged and efficiency is improved. However, due to limited increase in a refractive index of organic materials, a light exiting efficiency of a panel cannot be effectively improved.

SUMMARY OF INVENTION

Technical Issue

The present application provides a display panel and an electronic apparatus that can effectively improve light exiting efficiency of the display panel.

Technical Solution

In a first aspect, the present application provides a display panel, and the display panel comprises:
a base;
a display layer disposed on the base, wherein the display layer comprises a plurality of light emitting units; and
a touch layer disposed on a side of the display layer away from the base, and comprising a first insulation layer, a touch electrode layer, and a second insulation layer sequentially stacked on one another;
wherein the touch electrode layer comprises a plurality of touch electrodes, a first aperture is defined in a portion of each of the touch electrodes corresponding to the light emitting units, a first recess is defined in a portion of the first insulation layer corresponding to a gap between adjacent two of the light emitting units, the touch electrodes are disposed in the first recess, the second insulation layer covers the touch electrodes in the first recesses and portions of the second insulation layer corresponding to the first apertures contact the first insulation layer, and an included angle between a sidewall of the first recess and a bottom surface of the first recess is an obtuse angle.

In the display panel provided by the present application, a refractive index of the second insulation layer is less than a refractive index of the first insulation layer.

In the display panel provided by the present application, the refractive index of the second insulation layer ranges from 1.3 to 1.6, and the refractive index of the first insulation layer ranges from 1.6 to 1.9.

In the display panel provided by the present application, a cross-sectional shape of a sidewall of the first recess is a bent shape.

In the display panel provided by the present application, the first recess comprises a first sub-recess and a second sub-recess defined opposite to the first sub-recess, an included angle between a sidewall of the second sub-recess and a bottom surface of the first recess is unequal to an included angle between a sidewall of the first sub-recess and the bottom surface of the first recess.

In the display panel provided by the present application, the included angle between the sidewall of the second sub-recess and the bottom surface of the first recess is greater than the included angle between the sidewall of the first sub-recess and the bottom surface of the first recess.

In the display panel provided by the present application, an area of an orthographic projection of the second sub-recess on the base is smaller than an area of an orthographic projection of the first sub-recess on the base.

In the display panel provided by the present application, a cross-sectional shape of a sidewall of the first recess is an arc-shape.

In the display panel provided by the present application, the first insulation layer comprises a plurality of first protrusion portions, each of the first protrusion portion is disposed between adjacent two of the first recesses, and the first protrusion portions are disposed to correspond to the light emitting units.

In the display panel provided by the present application, a shape of an orthographic projection of the first protrusion portion on the base is the same as a shape of an orthographic projection of the light emitting unit on the base.

In the display panel provided by the present application, an area of the orthographic projection of the first protrusion portion on the base is the same as an area of the orthographic projection of the light emitting unit on the base.

In the display panel provided by the present application, material of the first insulation layer is inorganic material, and material of the second insulation layer is organic material.

In the display panel provided by the present application, the display panel further comprises a third insulation layer, the third insulation layer is disposed between the display layer and the touch layer; wherein bridge lines are disposed between the third insulation layer and the first insulation layer; the touch electrodes comprise a first portion and a second portion, and the first portion is connected to the second portion through the bridge lines.

In a second aspect, the present application also provides an electronic apparatus comprising a display panel, and the display panel comprises:
a base;
a display layer disposed on the base, wherein the display layer comprises a plurality of light emitting units; and
a touch layer disposed on a side of the display layer away from the base, and comprising a first insulation layer, a touch electrode layer, and a second insulation layer sequentially stacked on one another;
wherein the touch electrode layer comprises a plurality of touch electrodes, a first aperture is defined in a portion of each of the touch electrodes corresponding to the light emitting units, a first recess is defined in a portion of the first insulation layer corresponding to a gap between adjacent two of the light emitting units, the touch electrodes are disposed in the first recess, the second insulation layer covers the touch electrodes in the first recesses and portions of the second insulation layer corresponding to the first apertures contact the first insulation layer, and an included angle between a sidewall of the first recess and a bottom surface of the first recess is an obtuse angle.

In the electronic apparatus provided by the present application provides, a refractive index of the second insulation layer is less than a refractive index of the first insulation layer.

In the electronic apparatus provided by the present application provides, the refractive index of the second insulation layer ranges from 1.3 to 1.6, and the refractive index of the first insulation layer ranges from 1.6 to 1.9.

In the electronic apparatus provided by the present application provides, a cross-sectional shape of a sidewall of the first recess is a bent shape.

In the electronic apparatus provided by the present application provides, the first recess comprises a first sub-recess and a second sub-recess defined opposite to the first sub-recess, an included angle between a sidewall of the second sub-recess and a bottom surface of the first recess is unequal to an included angle between a sidewall of the first sub-recess and the bottom surface of the first recess.

In the electronic apparatus provided by the present application provides, the included angle between the sidewall of the second sub-recess and the bottom surface of the first recess is greater than the included angle between the sidewall of the first sub-recess and the bottom surface of the first recess.

In the electronic apparatus provided by the present application provides, an area of an orthographic projection of the second sub-recess on the base is smaller than an area of an orthographic projection of the first sub-recess on the base.

Advantages

The display panel and the electronic apparatus of the present application comprise: a base; a display layer disposed on the base, wherein the display layer comprises a plurality of light emitting units; and a touch layer disposed on a side of the display layer away from the base, and comprising a first insulation layer, a touch electrode layer, and a second insulation layer sequentially stacked on one another; wherein the touch electrode layer comprises a plurality of touch electrodes, a first aperture is defined in a portion of each of the touch electrodes corresponding to the light emitting units, a first recess is defined in a portion of the first insulation layer corresponding to a gap between adjacent two of the light emitting units, the touch electrodes are disposed in the first recess, the second insulation layer covers the touch electrodes in the first recesses and portions of the second insulation layer corresponding to the first apertures contact the first insulation layer, and an included angle between a sidewall of the first recess and a bottom surface of the first recess is an obtuse angle. Because the first insulation layer and the second insulation layer in the touch layer are combined together to form a light extraction structure, a difference between refractive indexes on the interface is effectively improved, which efficiently enhances a light exiting efficiency of the display panel.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

The embodiments as follows refer to the accompanying drawings for illustrating specific embodiments of the present invention that can be embodied. Directional terminologies mentioned by the present invention, for example "upper", "lower", "front", "rear", "left", "right", "top", "bottom", etc., only refer to directions of the accompanying drawings. Therefore, the employed directional terminologies are configured to indicate and make understanding for the present invention but is not for limiting the present invention. In the figure, structurally similar units are indicated by the reference characters.

The terms "first", "second", etc. in the description and claims of the present application and the above-mentioned drawings are used to distinguish different objects, not to describe a specific order. In addition, the terms "include" and "have" and any deformation of them is intended to cover non-exclusive inclusion.

Figure 1:
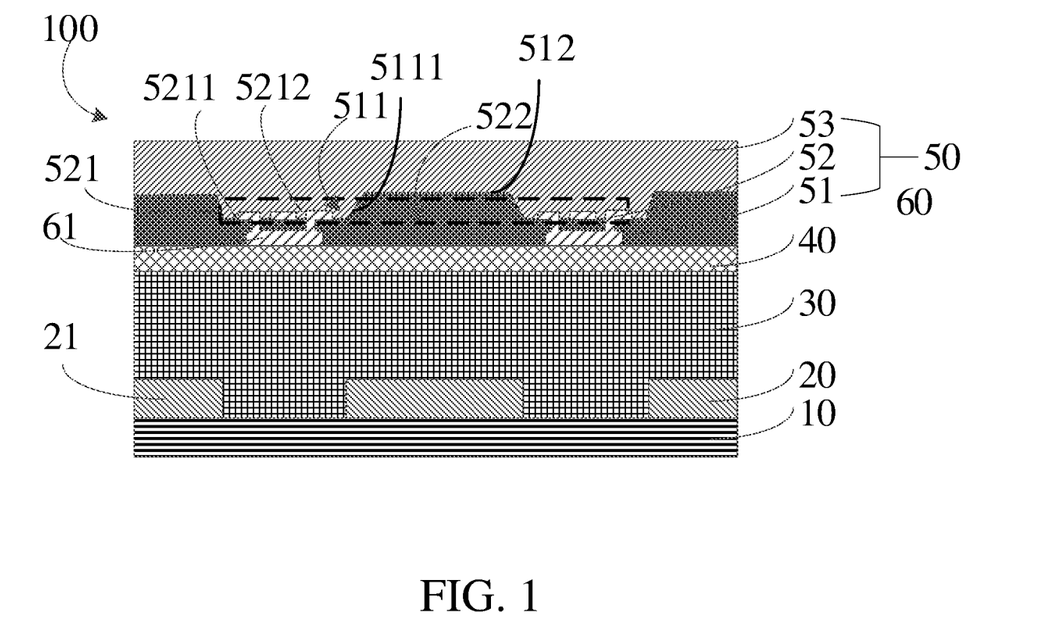
FIG. 1 is a cross-sectional view of a first embodiment of a display panel provided by the present application.
Figure 2:
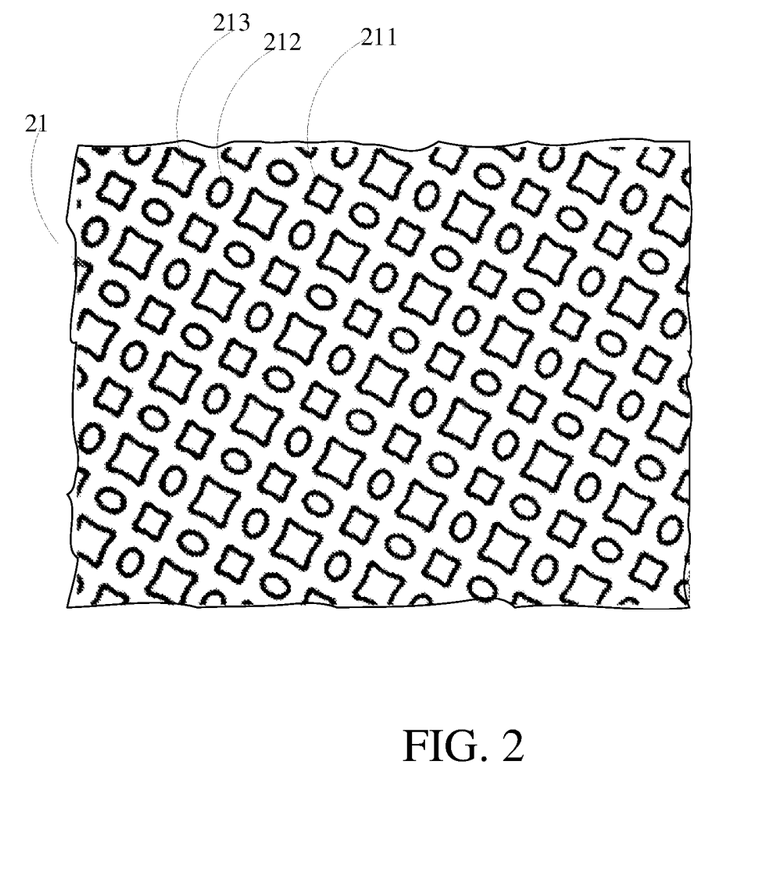
FIG. 2 is a top view of an embodiment of light emitting units of the display panel provided by the present application.
Figure 3:
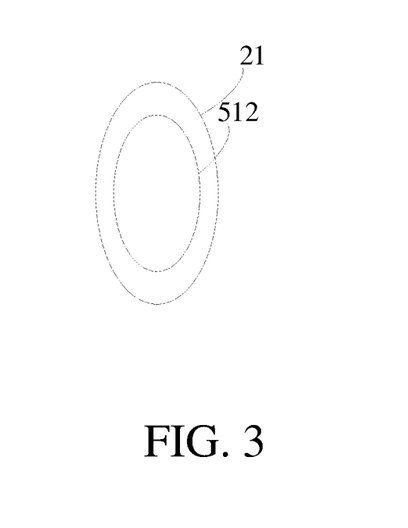
FIG. 3 is a top view of the light emitting units and a first recess of the display panel provided by the present application.

With reference to FIGS. 1 to 3, FIG. 1 is a cross-sectional view of a first embodiment of a display panel provided by the present application. FIG. 2 is a top view of an embodiment of light emitting units of the display panel provided by the present application. FIG. 3 is a top view of the light emitting units and a first recess of the display panel provided by the present application.

With reference to FIG. 1, the display panel 100 of the present embodiment comprises a base 10, a display layer 20, an encapsulation layer 30, a third insulation layer 40, and a touch layer 50. The base 10, the display layer 20, the encapsulation layer 30, the third insulation layer 40, and the touch layer 50 are sequentially stacked on one another.

The base 10 comprises an underlay substrate and a switch array layer, and material of the underlay substrate comprises one or more of glass, silicon dioxide, polyethylene, polypropylene, polystyrene, polylactic acid, polyethylene terephthalate, polyimide, and polyurethane. The switch array layer comprises film layers forming a transistor. The transistor can employ a transistor of a top gate structure, and can also employ a transistor of a bottom gate structure, which is not limited here.

The display layer 20 comprises a plurality of light emitting units 21. With reference to FIG. 2, the light emitting units 21 comprise red light emitting units 211, green light emitting units 212, and blue light emitting units 213. A cross-sectional structure of the light emitting units 21 comprises a first electrode, a light emitting layer, and a second electrode. In an embodiment, the first electrode is an anode, and the second electrode is a cathode. Material of the first electrode can be a lamination structure of ITO/Ag/ITO. Material of the light emitting layer can comprise a first light emitting material, a second light emitting material, and a third light emitting material. The second electrode is disposed on the light emitting layer, and material of the second electrode can be transparent conductive material. Of course, it can be understood that a structure of the display layer is not limited here.

The encapsulation layer 30 is disposed on the display layer 20. In an embodiment, encapsulation layer 30 comprises first inorganic layer (not shown in the figures). In another embodiment, encapsulation layer 30 comprises a first inorganic layer and a second inorganic layer (all are not shown in the figures) disposed on the first inorganic layer. Furthermore, the encapsulation layer 30 further can comprise an organic layer, and the organic layer is disposed between the first inorganic layer and the second inorganic layer.

The third insulation layer 40 is disposed on the encapsulation layer 30. Material of the third insulation layer 40 comprises one or more of $SiO_2$, $SiN_x$, and $Al_2O_3$. The third insulation layer 40 is configured to isolate the encapsulation layer 30 from the touch layer 50.

The touch layer 50 is disposed on the third insulation layer 40. Namely, the touch layer 50 is disposed on a side of the display layer 20 away from the base 10. The touch layer 50 comprises a first insulation layer 51, a touch electrode layer 52, and a second insulation layer 53 that are sequentially stacked on one another. The touch electrode layer 52 comprises a plurality of touch electrodes 521. A first aperture 522 is defined in a portion of each of the touch electrodes 521 corresponding to the light emitting units 21. A first recess 511 is defined in a portion of the first insulation layer 51 corresponding to a gap between adjacent two of the light emitting units 21. The touch electrodes 521 are disposed in the first recess 511. The second insulation layer 53 covers the touch electrodes 521 in the first recess 511, and contacts the first insulation layer 51 in the first aperture 522. An included angle between a sidewall 5111 of the first recess 511 and a bottom surface of the first recess is an obtuse angle.

Specifically, the display panel 100 further comprises a conductive layer 60. The conductive layer 60 is disposed on the third insulation layer 40. The conductive layer 60 comprises a plurality of bridge lines 61. Specifically, the conductive layer 60 is disposed on a portion of the third insulation layer 40. Namely, the conductive layer 60 is disposed between the third insulation layer 40 and the first insulation layer 51. Material of the conductive layer 60 can be metal material, for example Ti/Al/Ti. Of course, specific material is not limited thereto. In other embodiment, material of the conductive layer 60 can also be transparent conductive material, and specific material is not limited thereto.

The touch electrode layer 52 is disposed on the conductive layer 60. The touch electrode layer 52 is connected to the conductive layer 60. In an embodiment, the touch electrode layer 52 can comprise a first portion 5211 and a second portion 5212. The first portion 5211 intersects the second portion 5212. The first portion 5211 is connected to the second portion 5212 through the bridge lines 61. Material of the touch electrode layer 52 can be the same of material of the conductive layer 60. A shape of the touch electrodes 521 in the top view can be a grid-like shape.

In some embodiments, the sidewall 5111 of the first recess 511 is disposed obliquely relative to a side of the first insulation layer 51 near the display layer 20. Namely, an included angle is defined between the sidewall 5111 of the first recess 511 and a side of the first insulation layer 51 near the display layer 20. In an embodiment, a via hole is defined in the first insulation layer 51, and the touch electrode layer 52 extends in the via hole to connect with the conductive layer 60.

The second insulation layer 53 covers the touch electrodes 521 and the first recess 511. The second insulation layer 53 is disposed on the touch electrode layer 52. A refractive index of material of the second insulation layer 53 is less than a refractive index of material of the first insulation layer 51. A thickness of the second insulation layer 53 and a thickness of the first insulation layer 51 are set according to specific needs. In a preferred embodiment, to reduce light loss, material of the second insulation layer 53 and the first insulation layer 51 is transparent insulative material. The second insulation layer 53 has a better levelling characteristic to improve flatness of the display panel.

Material of the first insulation layer 51 is inorganic material, and material of the second insulation layer 53 is organic material. Because a light converging interface is formed by using the inorganic material of a low refractive index and the organic material of a high refractive index, a light exiting efficiency is improved. In an embodiment, material of the first insulation layer 51 can comprise but is not limited to $SiONX$ or $SiN$. Material of the second insulation layer 53 can comprise photosensitive resin composite. In some embodiments, to further reduce a thickness of the display panel, material of the second insulation layer 53 is an organic optical clear adhesive.

In some embodiments, to further improve the light exiting effect, the refractive index of material of the second insulation layer 53 ranges from 1.3 to 1.6, and the refractive index of material of the first insulation layer 51 ranges from 1.6 to 1.9. It can be understood that in other embodiment, the refractive indexes of the material of the second insulation layer 53 and the first insulation layer 51 are not limited thereto.

Because the inorganic material of the high refractive index and the organic material of the low refractive index are used to assemble an inclined interface to form light extraction structure, and the inorganic material can produce a higher refractive index which is far higher than the high refractive index of the organic material, therefore a difference between the refractive indexes on the interface is effectively increased to efficiently enhance the light exiting efficiency of the display panel. Furthermore, combining the insulation layer in the touch unit with the insulation layer above the touch unit to form the light extraction structure can omit an insulation layer, which therefore reduces a number of the film layers and decreases the thickness of the display panel.

In some embodiments, to further improve the light converging effect, a location of the first recess 511 corresponds to a location of the gap between the adjacent the light emitting units 21. Namely, the first insulation layer 51 comprises a plurality of first protrusion portions 512, each of the first protrusion portions 512 is disposed between adjacent two of the first recess 511. The first protrusion portions 512 are disposed to correspond to the light emitting units 21. A cross-sectional shape of the first recess 511 is the same as a cross-sectional shape of a corresponding gap between adjacent two of the light emitting units 21. Of course, in other embodiment, the cross-sectional shape of the first recess 511 can also be different from the cross-sectional shape of the gap of between adjacent two of the light emitting units 21. In the meantime, a difference between an area of an orthographic projection of the first recess 511 on the base 10 and an area of an orthographic projection of the gap between adjacent two of the light emitting units 21 on the base 10 is within a predetermined range, and the predetermined range is about 0.

In some embodiments, a shape of the first recess 511 in the top view comprises at least one of circular, oval, rhomboid, or square. It can be understood that shapes of the red light emitting unit 211, the green light emitting unit 212, and the blue light emitting unit 213 in the top view can also comprise at least one of circular, oval, rhomboid, or square. For example, a shape of the green light emitting unit 212 in the top view can be oval, and the shape of the first recess 511 corresponding to the green light emitting unit 212 in the top view can also be oval. Of course, it can be understood that for the light emitting unit of other color, a shape of the corresponding first recess 511 is similar thereto and will not be repeatedly described here. Of course, a shape of the light emitting unit in a top view is not limited here.

In some embodiments, to further improve the light exiting efficiency, an area of an orthographic projection of the first recess 511 on the base 10 is the same as or approximately equal to an area of an orthographic projection of the corresponding gap between adjacent two of the light emitting units 21 on the base 10. In some embodiments, an area of an orthographic projection of the first recess 511 on the base 10 is slightly larger than or slightly smaller than an area of an orthographic projection of a gap of adjacent two of the corresponding the light emitting units 21 on the base 10. In other words, the projections of the first recess 511 and the gap between the adjacent the light emitting units 21 on base 10 overlap. Alternatively, a horizontal axis of symmetry of a shape of the first recess 511 in the top view and a horizontal axis of symmetry of the light emitting units have a certain included angle.

In some embodiments, the above display panel 100 further comprises a cover plate, and the cover plate is attached to the third insulation layer by adhesive.

The display panel of the present application comprises: a base; a display layer disposed on the base, wherein the display layer comprises a plurality of light emitting units; and a touch layer disposed on a side of the display layer away from the base, and comprising a first insulation layer, a touch electrode layer, and a second insulation layer sequentially stacked on one another; wherein the touch electrode layer comprises a plurality of touch electrodes, a first aperture is defined in a portion of each of the touch electrodes corresponding to the light emitting units, a first recess is defined in a portion of the first insulation layer corresponding to a gap between adjacent two of the light emitting units, the touch electrodes are disposed in the first recess, the second insulation layer covers the touch electrodes in the first recesses and portions of the second insulation layer corresponding to the first apertures contact the first insulation layer, and an included angle between a sidewall of the first recess and a bottom surface of the first recess is an obtuse angle. Because the inorganic material of the high refractive index and the organic material of the low refractive index are used to assemble an inclined interface to form light extraction structure, and the inorganic material can produce a higher refractive index which is far higher than the high refractive index of the organic material, therefore a difference between the refractive indexes on the interface is effectively increased to efficiently enhance the light exiting efficiency of the display panel.

Figure 4:
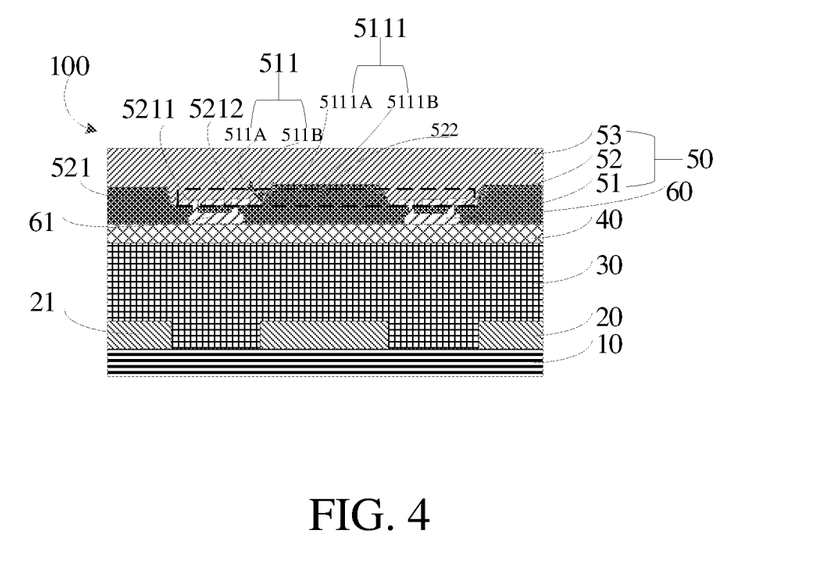
FIG. 4 is a cross-sectional view of a second embodiment of the display panel provided by the present application.

With reference to FIG. 4, FIG. 4 is a cross-sectional view of a second embodiment of the display panel provided by the present application. With reference to FIG. 4, a difference between the display panel 100 of the present embodiment from the display panel 100 of the former embodiment is that the shape of the sidewall 5111 of the first recess 511 of the present embodiment is a bent shape, i.e., a non-straight shape.

In some embodiments, with reference to FIG. 4, the first recess 511 comprises a first sub-recess 511A and a second sub-recess 511B. An included angle between a sidewall 5111B of the second sub-recess 511B and the first insulation layer 51 is unequal to an included angle between the sidewall 5111A of the first sub-recess 511A and the first insulation layer 51, and namely, the first recess 511 comprises a slope with two angles.

In an embodiment, the included angle between the sidewall 5111B of the second sub-recess 511B and the first insulation layer 51 is greater than an included angle between the sidewall 5111A of the first sub-recess 511A and the first insulation layer 51. For example, the included angle between the sidewall 5111B of the second sub-recess 511B and the first insulation layer 51 is 90 degrees, and the included angle between the sidewall 5111A of the first sub-recess 511A and the first insulation layer 51 is less than 90 degrees. In some embodiments, an area of an orthographic projection of the second sub-recess 511B on the base 10 is smaller than an area of an orthographic projection of the first sub-recess 511A on the base 10. In some other embodiments, the area of the orthographic projection of the second sub-recess 511B on the base 10 can be larger than the area of the orthographic projection of the first sub-recess 511A on the base 10.

During specific manufacturing processes, the first insulation layer 51 can be patterned to obtain the first recess 511, and then the first recess 511 is etched multiple times to obtain the first sub-recess 511A and the second sub-recess 511B.

Of course, it can be understood that the first recess 511 can have sub-slopes with more angles, namely, the first recess 511 can comprise two or more sub-recesses, and included angles between the sidewalls of adjacent two of the sub-recesses and the first insulation layer 51 are not equal. Alternatively, the shape of the sidewall of the first recess 511 is a bent shape, i.e., a non-flat structure. In a cross-sectional figure, the cross-sectional shape of the first recess 511 is not trapezoidal, and a shape of the sidewall of the first recess 511 is a stepped shape.

In some other embodiments, the included angle between the sidewall 5111B of the second sub-recess 511B and the first insulation layer 51 can also be equal to the included angle between the sidewall 5111A of the first sub-recess 511A and the first insulation layer 51, namely, structures of the first sub-recess 511A and the second sub-recess 511B are the same. Namely, the first recess 511 comprises a plurality of first sub-recesses 511A overlapping with one another along a vertical direction. In the meantime, the shape of the sidewall of the first recess 511 is a sawtooth shape. In an embodiment, the area of the orthographic projection of the second sub-recess 511B on the base 10 can be smaller than or equal to the area of the orthographic projection of the first sub-recess 511A on the base 10. Of course, it can be understood that the first recess 511 can also comprise two or more sub-recesses, and in the meantime, the included angles between sidewalls of sub-portions and the first insulation layer 51 are the same.

Figure 5:
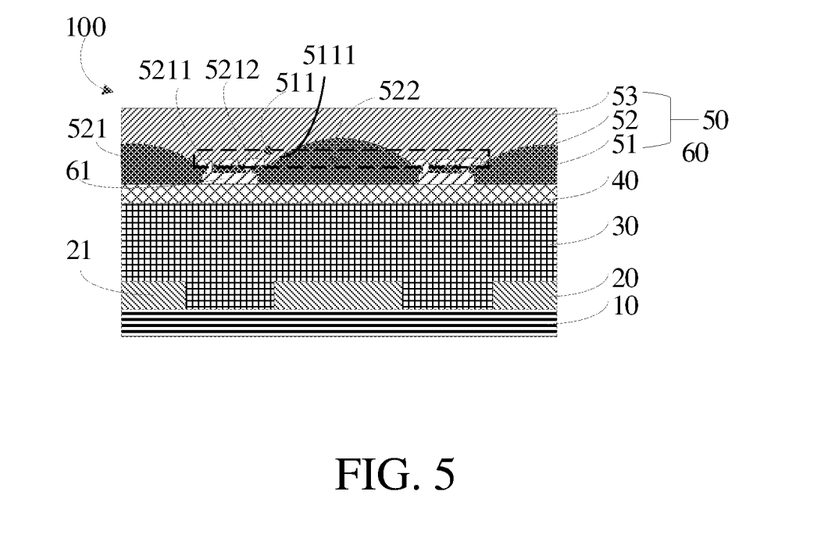
FIG. 5 is a cross-sectional view of a third embodiment of the display panel provided by the present application.

In some other embodiments, with reference to FIG. 5, FIG. 5 is a cross-sectional view of a third embodiment of the display panel provided by the present application. As shown in FIG. 5, a cross-sectional shape of the first recess 511 is an arc-shape, and a shape of a top of the first recess 511 is an arc-shape. In an embodiment, the cross-sectional shape of the first recess 511 comprises at least one of oval or semi-circular.

The display panel of the present application comprises: a base; a display layer disposed on the base, wherein the display layer comprises a plurality of light emitting units; and a touch layer disposed on a side of the display layer away from the base, and comprising a first insulation layer, a touch electrode layer, and a second insulation layer sequentially stacked on one another; wherein the touch electrode layer comprises a plurality of touch electrodes, a first aperture is defined in a portion of each of the touch electrodes corresponding to the light emitting units, a first recess is defined in a portion of the first insulation layer corresponding to a gap between adjacent two of the light emitting units, the touch electrodes are disposed in the first recess, the second insulation layer covers the touch electrodes in the first recesses and portions of the second insulation layer corresponding to the first apertures contact the first insulation layer, and an included angle between a sidewall of the first recess and a bottom surface of the first recess is an obtuse angle. A shape of the sidewall of the first recess is a bent shape, or a shape of the first recess is an arc-shape. It can be seen that on the basis of an embodiment, because a shape of the sidewall of the first recess 511 of the present embodiment is a non-straight shape, light emitted from the display panel is emitted out after multiple refraction, which therefore further improves light exiting efficiency.

It can be understood that the display panel of the present application can be an organic light emitting diode display panel, and can also be a liquid crystal display panel. In a preferred embodiment, to further improve the display effect and reduce the thickness of the display panel, the display panel of present application is an organic light emitting diode display panel.

Figure 6:
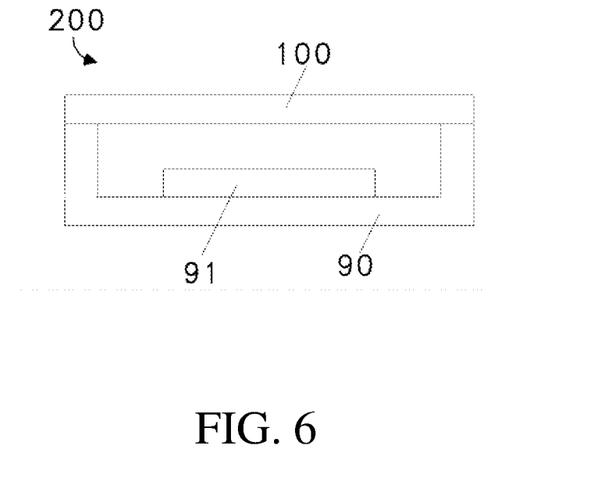
FIG. 6 is a schematic structural view of an embodiment of an electronic apparatus provided by the present application.

With reference to FIG. 6, FIG. 6 is a schematic structural view of an embodiment of an electronic apparatus provided by the present application.

The electronic apparatus 200 can comprise any display panel 100 as described above, a control circuit 91, and a casing 90. It should be explained that the electronic apparatus 200 as shown in FIG. 6 is not limited to the above-mentioned contents, and can further comprise other devices such as camera, antenna structure, fingerprint unlock module, etc.

The display panel 100 is disposed on the casing 90.

In some embodiments, the display panel 100 can be mounted securely on the casing 90, and the display panel 100 and the casing 90 form a hermetic space to accommodate a device such as the control circuit 91.

In some embodiments, the casing 90 can be made of flexible material, for example, a plastic casing or a silicone casing.

The control circuit 91 is installed in the casing 90, and the control circuit 91 can be a mainboard of the electronic apparatus 200. One, two or more of functional assemblies such as antenna structure, microphone, speaker, headphone jack, universal serial bus interface, camera, distance sensor, ambient light sensor, receiver, and processor can be integrated on the control circuit 91.

The display panel 100 is installed in the casing 90, and simultaneously the display panel 100 is electrically connected to the control circuit 91 to form a display surface of the electronic apparatus 200. The display panel 100 can comprise a display region and a non-display region. The display region can be configured to display images of the electronic apparatus 200 or allow a user's touch operation. The non-display region is configured to dispose various functional assemblies thereon.

The electronic apparatus comprises but is not limited to mobile phones, tablet computers, computer monitors, game consoles, televisions, display screens, wearable devices and other household appliances or living appliances with display functions, etc.

The display panel and the electronic apparatus of the present application comprise: a base; a display layer disposed on the base, wherein the display layer comprises a plurality of light emitting units; and a touch layer disposed on a side of the display layer away from the base, and comprising a first insulation layer, a touch electrode layer, and a second insulation layer sequentially stacked on one another; wherein the touch electrode layer comprises a plurality of touch electrodes, a first aperture is defined in a portion of each of the touch electrodes corresponding to the light emitting units, a first recess is defined in a portion of the first insulation layer corresponding to a gap between adjacent two of the light emitting units, the touch electrodes are disposed in the first recess, the second insulation layer covers the touch electrodes in the first recesses and portions of the second insulation layer corresponding to the first apertures contact the first insulation layer, and an included angle between a sidewall of the first recess and a bottom surface of the first recess is an obtuse angle. Because the inorganic material of the high refractive index and the organic material of the low refractive index are used to assemble an inclined interface to form light extraction structure, and the inorganic material can produce a higher refractive index which is far higher than the high refractive index of the organic material, therefore a difference between the refractive indexes on the interface is effectively increased to efficiently enhance the light exiting efficiency of the display panel.

The display panel and the electronic apparatus provided by the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present the idea of invention, changes will be made in specific embodiment and application. In summary, the contents of this specification should not be construed as limiting the present application.

What is claimed is:

1. A display panel, comprising:
   a base;
   a display layer disposed on the base, wherein the display layer comprises a plurality of light emitting units; and
   a touch layer disposed on a side of the display layer away from the base, and comprising a first insulation layer, a touch electrode layer, and a second insulation layer sequentially stacked on one another;
   wherein the touch electrode layer comprises a plurality of touch electrodes, a first aperture is defined in a portion of each of the touch electrodes corresponding to the light emitting units, a first recess is defined in a portion of the first insulation layer corresponding to a gap between adjacent two of the light emitting units, the touch electrodes are disposed in the first recess, the second insulation layer covers the touch electrodes in the first recesses and portions of the second insulation layer corresponding to the first apertures contact the first insulation layer, and an included angle between a sidewall of the first recess and a bottom surface of the first recess is an obtuse angle;

wherein the first recess comprises a first sub-recess and a second sub-recess defined concentrically in the first sub-recess in different sizes and different depths such that the sidewall of the first recess is a non-flat surface.

2. The display panel according to claim 1, wherein a refractive index of the second insulation layer is less than a refractive index of the first insulation layer.

3. The display panel according to claim 2, wherein the refractive index of the second insulation layer ranges from 1.3 to 1.6, and the refractive index of the first insulation layer ranges from 1.6 to 1.9.

4. The display panel according to claim 2, wherein a cross-sectional shape of the sidewall of the first recess is a bent shape.

5. The display panel according to claim 4, wherein an included angle between a sidewall of the second sub-recess and a bottom surface of the first recess is unequal to an included angle between a sidewall of the first sub-recess and the bottom surface of the first recess.

6. The display panel according to claim 5, wherein the included angle between the sidewall of the second sub-recess and the bottom surface of the first recess is greater than the included angle between the sidewall of the first sub-recess and the bottom surface of the first recess.

7. The display panel according to claim 6, wherein an area of an orthographic projection of the second sub-recess on the base is smaller than an area of an orthographic projection of the first sub-recess on the base.

8. The display panel according to claim 2, wherein a cross-sectional shape of the sidewall of the first recess is an arc-shape.

9. The display panel according to claim 2, wherein the first insulation layer comprises a plurality of first protrusion portions, each of the first protrusion portions is disposed between adjacent two of the first recesses, and the first protrusion portions are disposed to correspond to the light emitting units.

10. The display panel according to claim 9, wherein a shape of an orthographic projection of the first protrusion portions on the base is same as a shape of an orthographic projection of the light emitting units on the base.

11. The display panel according to claim 10, wherein an area of the orthographic projection of the first protrusion portions on the base is same as an area of the orthographic projection of the light emitting units on the base.

12. The display panel according to claim 1, wherein material of the first insulation layer is inorganic material, and material of the second insulation layer is organic material.

13. The display panel according to claim 1, wherein the display panel further comprises a third insulation layer, the third insulation layer is disposed between the display layer and the touch layer; wherein bridge lines are disposed between the third insulation layer and the first insulation layer; the touch electrodes comprise a first portion and a second portion, and the first portion is connected to the second portion through the bridge lines.

14. An electronic apparatus, comprising a display panel, and the display panel comprising:
a base;
a display layer disposed on the base, wherein the display layer comprises a plurality of light emitting units; and
a touch layer disposed on a side of the display layer away from the base, and comprising a first insulation layer, a touch electrode layer, and a second insulation layer sequentially stacked on one another;
wherein the touch electrode layer comprises a plurality of touch electrodes, a first aperture is defined in a portion of each of the touch electrodes corresponding to the light emitting units, a first recess is defined in a portion of the first insulation layer corresponding to a gap between adjacent two of the light emitting units, the touch electrodes are disposed in the first recess, the second insulation layer covers the touch electrodes in the first recesses and portions of the second insulation layer corresponding to the first apertures contact the first insulation layer, and an included angle between a sidewall of the first recess and a bottom surface of the first recess is an obtuse angle;
wherein the first recess comprises a first sub-recess and a second sub-recess defined concentrically in the first sub-recess in different sizes and different depths such that the sidewall of the first recess is a non-flat surface.

15. The electronic apparatus according to claim 14, wherein a refractive index of the second insulation layer is less than a refractive index of the first insulation layer.

16. The electronic apparatus according to claim 15, wherein the refractive index of the second insulation layer ranges from 1.3 to 1.6, and the refractive index of the first insulation layer ranges from 1.6 to 1.9.

17. The electronic apparatus according to claim 15, wherein a cross-sectional shape of the sidewall of the first recess is a bent shape.

18. The electronic apparatus according to claim 17, wherein an included angle between a sidewall of the second sub-recess and a bottom surface of the first recess is unequal to an included angle between a sidewall of the first sub-recess and the bottom surface of the first recess.

19. The electronic apparatus according to claim 18, wherein the included angle between the sidewall of the second sub-recess and the bottom surface of the first recess is greater than the included angle between the sidewall of the first sub-recess and the bottom surface of the first recess.

20. The electronic apparatus according to claim 19, wherein an area of an orthographic projection of the second sub-recess on the base is smaller than an area of an orthographic projection of the first sub-recess on the base.

* * * * *